(12) United States Patent
Rindlisbacher et al.

(10) Patent No.: US 7,145,340 B2
(45) Date of Patent: Dec. 5, 2006

(54) NMR SPECTROMETER WITH FLOWTHROUGH SAMPLE CONTAINER

(75) Inventors: Martin Rindlisbacher, Concord, MA (US); Werner E. Maas, Boxford, MA (US)

(73) Assignee: Broker Biospin Corporation, Billerica, MA (US)

( * ) Notice: Subject to any disclaimer, the term of this patent is extended or adjusted under 35 U.S.C. 154(b) by 0 days.

(21) Appl. No.: 10/981,386

(22) Filed: Nov. 4, 2004

(65) Prior Publication Data

US 2006/0091885 A1    May 4, 2006

(51) Int. Cl.
*G01V 3/00* (2006.01)
(52) U.S. Cl. ........................ 324/321; 324/318
(58) Field of Classification Search ................ 324/321, 324/318, 319, 322, 306, 300, 309, 307; 600/410, 600/422
See application file for complete search history.

(56) References Cited

U.S. PATENT DOCUMENTS

| | | | | |
|---|---|---|---|---|
| 2,955,252 A | * | 10/1960 | Williams | 324/307 |
| 4,247,820 A | * | 1/1981 | Keller et al. | 324/321 |
| 4,775,836 A | | 10/1988 | Starewicz et al. | |
| 5,867,026 A | * | 2/1999 | Haner | 324/321 |
| 6,177,798 B1 | * | 1/2001 | Haner et al. | 324/321 |
| 6,380,737 B1 | * | 4/2002 | Myles | 324/306 |
| 6,396,274 B1 | * | 5/2002 | Commens et al. | 324/321 |
| 6,507,191 B1 | * | 1/2003 | Eguchi et al. | 324/318 |
| 6,838,880 B1 | * | 1/2005 | Hofmann et al. | 324/318 |
| 2002/0050821 A1 | | 5/2002 | Iwata | |

FOREIGN PATENT DOCUMENTS

WO    WO 03/079034 A2    9/2003

* cited by examiner

*Primary Examiner*—Brij B. Shrivastav
(74) *Attorney, Agent, or Firm*—Law Offices of Paul E. Kudirka

(57) ABSTRACT

A flow-through sample container, or flow cell, according to the present invention resides with the channel of magnetic resonance probe without being fixed thereto. The flow cell is removable from the spectrometer while leaving the probe in place, allowing easy cleaning of the probe channel and replacement of the flow cell. An insertion tool that houses the flow cell may be used to safely introduce it to the probe. Input and output capillaries serve as fluid pathways for fluid samples entering and leaving the flow cell, respectively. These capillaries may be connected to the flow cell with a manually operable connector, allowing easy disconnection of the flow cell from the input and output conduit. The capillaries enter through different ends of the spectrometer bore, so that the fluid samples flow enter one end of the spectrometer and exit through the other.

18 Claims, 9 Drawing Sheets

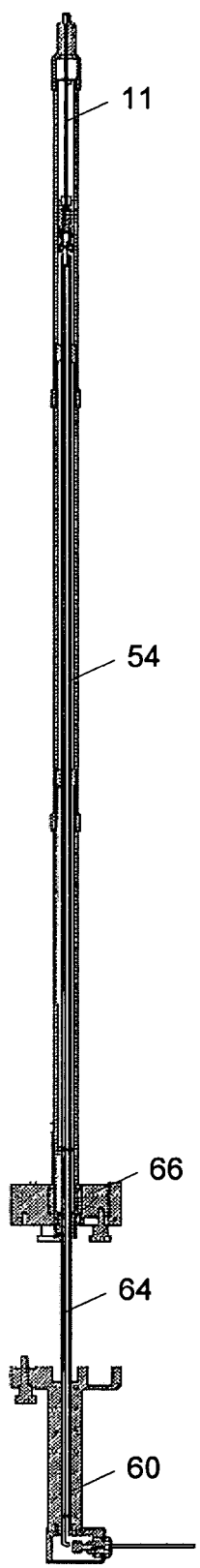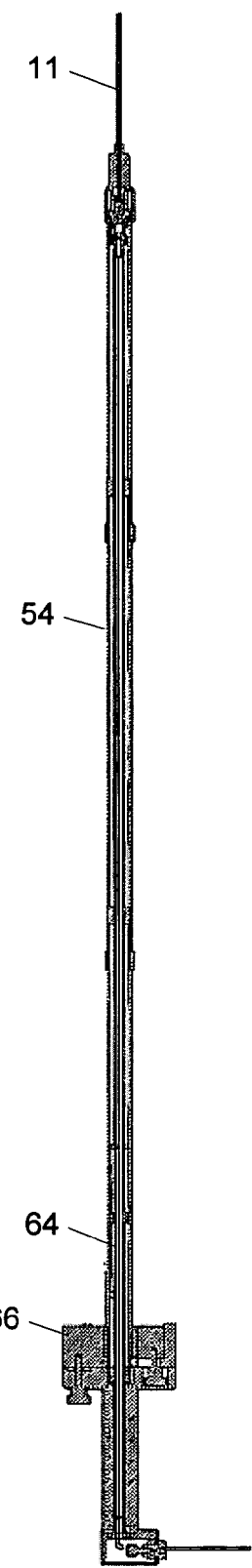
*FIGURE 6A*  *FIGURE 6B*

NMR SPECTROMETER WITH FLOWTHROUGH SAMPLE CONTAINER

FIELD OF THE INVENTION

This invention relates generally to the field of nuclear magnetic resonance (NMR) spectroscopy and, more particularly, to an NMR spectrometer in which a sample material may flow into and out of a sample holder while it is positioned in the spectrometer.

BACKGROUND OF THE INVENTION

In the field of NMR spectroscopy, a sample is surrounded by an NMR probe that consists of a radio frequency (RF) coil tuned to generate a field at a desired excitation frequency and receive a return NMR signal. The spectrometer typically consists of a large magnet that generates a static magnetic field, and that surrounds a sample region of the spectrometer. A sample is located in a discrete sample tube and introduced to the sample region of a probe assembly. The probe assembly includes a housing that fits within the magnet bore, and that contains the RF coil. For a probe that uses a single RF coil, the coil typically surrounds the sample tube when the sample is introduced to the probe, and generates an RF pulse that induces a return NMR signal from the sample that is detected using the RF coil.

When analyzing a fluid sample with an NMR spectrometer, the sample is typically sealed within a sample tube. The tube is then introduced to the probe of the spectrometer, so as to locate the sample tube in the appropriate sample region. By proper activation of the RF coil, and detection of the resulting NMR signal, an NMR spectrum is compiled. The sample tube is then removed, and a new sample tube introduced to the probe. This process of testing one sample tube at a time is effective, but is highly laborious and time-consuming.

Certain prior art NMR spectrometers have been constructed in the past that use a sample container that allows a liquid sample to flow into and out of the container while the probe is positioned in the probe in the bore of the NMR magnet. This allows new samples to be introduced to the sample region without having to remove the sample tube and introduce a new one. Typically, however, these flow-though sample cells are fragile and expensive to replace. Moreover, such flow-through sample tubes are simply placed into a probe intended for discrete sample tubes. For example, a dual-function NMR probe has been described in U.S. Pat. No. 6,396,274 which allows a user to convert the probe operation between stationary sample tubes and a flow-through sample tube. In this system, a flow cell may be located in the NMR probe in a space surrounded by an RF coil. The flow cell may also be removed, and a discrete sample tube located in the same space.

SUMMARY OF THE INVENTION

In accordance with the present invention, a liquid sample apparatus is provided for use with a magnetic resonance spectrometer that has a sample probe located in a bore of the spectrometer. The apparatus includes a liquid sample container that is open at a first end and at an opposite end, so that liquid can flow therethrough. The sample container is configured to fit, at least partially, within a channel of the probe, so that a sample region of the container lies adjacent to the RF coil of the probe. An input conduit connects to the first end of the sample container, and an output conduit connects to the opposite end. These conduits may be capillary tubing that extend, respectively, out of a first side and a second side of the spectrometer bore. With the input conduit connected to a liquid sample source, and the output conduit connected to an output container, a liquid sample may "flow-though" the spectrometer.

With the configuration of the present invention, a sample to be analyzed may be delivered from the sample source, through the input conduit and to the sample container where it undergoes a magnetic resonance analysis. After the analysis, it may then be delivered from the sample container out through the output conduit to a waste container, for example. This flow-through construction allows samples to be easily introduced one after the other to the sample container, one being removed while another is being loaded. Moreover, the samples flow in the same direction traveling into and out of the spectrometer bore.

The sample container of the present invention may be removed from the probe without removing the probe from the spectrometer. An insertion tool may be used that is switchable between a retracted position and an extended position. In the retracted position, the sample container is encompassed by a housing of the insertion tool. The insertion tool is then located adjacent to the probe, and changed to the extended position. In the extended position, the sample container projects at least partially beyond the insertion tool housing such that it extends into the probe with the sample region adjacent to the RF coil of the probe. Use of the insertion tool allows safe and easy changing of the sample container.

The input conduit may reside within the insertion tool during sample transfer and analysis. Adjacent to the conduit may be located a heating element that transfers heat to the sample within the conduit. This allows a sample temperature to be increased to a level most beneficial for sample analysis. Adjacent to the capillary, between the sample container and the heating element, there may also be located a temperature monitor that detect the temperature of the sample prior to its entering the sample container. A signal from this temperature monitor may be input to a controller that uses the signal to control the operation of the heating element. In this way, feedback control of the sample temperature is provided.

The sample container may be of an appropriate material, such as glass, and may have a particular internal structure. For example, the container may have flow paths adjacent, respectively, to its first and second ends, and a sample region located between the fluid paths that has a larger inner diameter than either of the flow paths. This allows concentration of the sample in the flow region, which will typically be directly adjacent to the RF coil of the probe. The ends of the sample container may be connected to the input and output conduits, respectively, via manually operable connectors that allow the easy connection and disconnection of the sample container to the conduits.

One embodiment of a connector may be a component that is removably fixed to one of the conduits, for example the input conduit, by using a connecting means such as screw threads. The connector may be manually removable from the sample container, and include a radially-flexible portion. This portion can expand to slide over one end of the sample container, and be aligned with a notch in the outer surface of the sample container. The radially-flexible portion may then be radially restrained in the notch to create a detent that secures the connector to the sample container. A retaining ring may be provided that can be drawn around the radially-flexible portion to maintain it in a restrained state while it resides in the notch of the sample container.

With two connectors, each securing one of the two ends of the sample container, the entire flow-through sample apparatus is made fluid tight, from the input conduit, to the sample container, to the output conduit. Either or both of the conduits may have a tapered end that seats against a surface of the sample container. A biasing mechanism, such as a compression spring, may be used to maintain the connection between the conduit and the sample container.

A probe according to the present invention may have an inner surface that provides a fluid-tight seal between the components housed in the probe and a probe channel within which the sample container may be located. The surface of the probe that faces the probe channel may also be a continuous, smooth surface, such as a cylindrical surface, that allows easy flushing of the probe channel. As such, the probe may be cleaned while in place in the spectrometer housing. With removal of the insertion tool and sample container, and any associated fluid conduits, a fluid, such as a liquid solvent, may be introduced to the probe channel to flush out any contaminants. This allows cleaning of the probe without the need to remove the probe and undergo the subsequent realignment and shimming procedures.

BRIEF DESCRIPTION OF THE DRAWINGS

The above and further advantages of the invention may be better understood by referring to the following description in conjunction with the accompanying drawings in which:

FIG. 6A is a cross-sectional view of an insertion tool like that shown in FIG. 5, where the insertion tool is in a retracted position;

FIG. 6B is a cross-sectional view of an insertion tool like that shown in FIG. 5, where the insertion tool is in an extended position;

DETAILED DESCRIPTION

Figure 1:
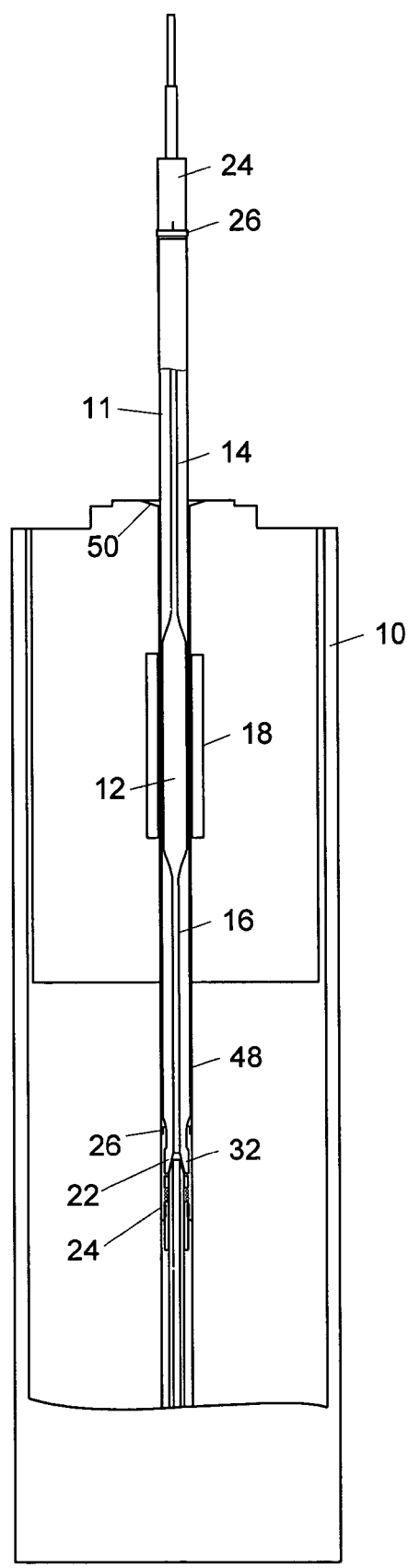
FIG. 1 is a schematic, partial cutaway view of a flow cell according to the present invention as positioned within the channel of a spectrometer probe.

Shown in FIG. 1 is a portion of an NMR probe 10 according to the present invention, with a cutaway region showing a flow cell apparatus inside. The sample chamber 12 of the flow cell 11 comprises a cylindrical glass tube with an inner diameter that is tapered at either end of the sample chamber. The tapered ends of the sample chamber 12 reduce the diameter of the fluid space at either end of the sample tube to a capillary tube dimension, and these narrow pathways 14, 16 allow fluid flow into and out of the sample chamber 12. An outer shape of the flow cell is cylindrical, extending above and below the sample chamber 12. Within the probe 10, located very closely around the outside of the flow cell, is an RF coil 18 that provides the NMR RF pulse for inducing an NMR response from a sample fluid within the sample chamber. As shown, the thin wall of the sample chamber allows the RF coil to be in close proximity to the sample fluid, thereby maintaining a very large filling factor, and a correspondingly high degree of sensitivity in the spectrometer.

Figure 2:
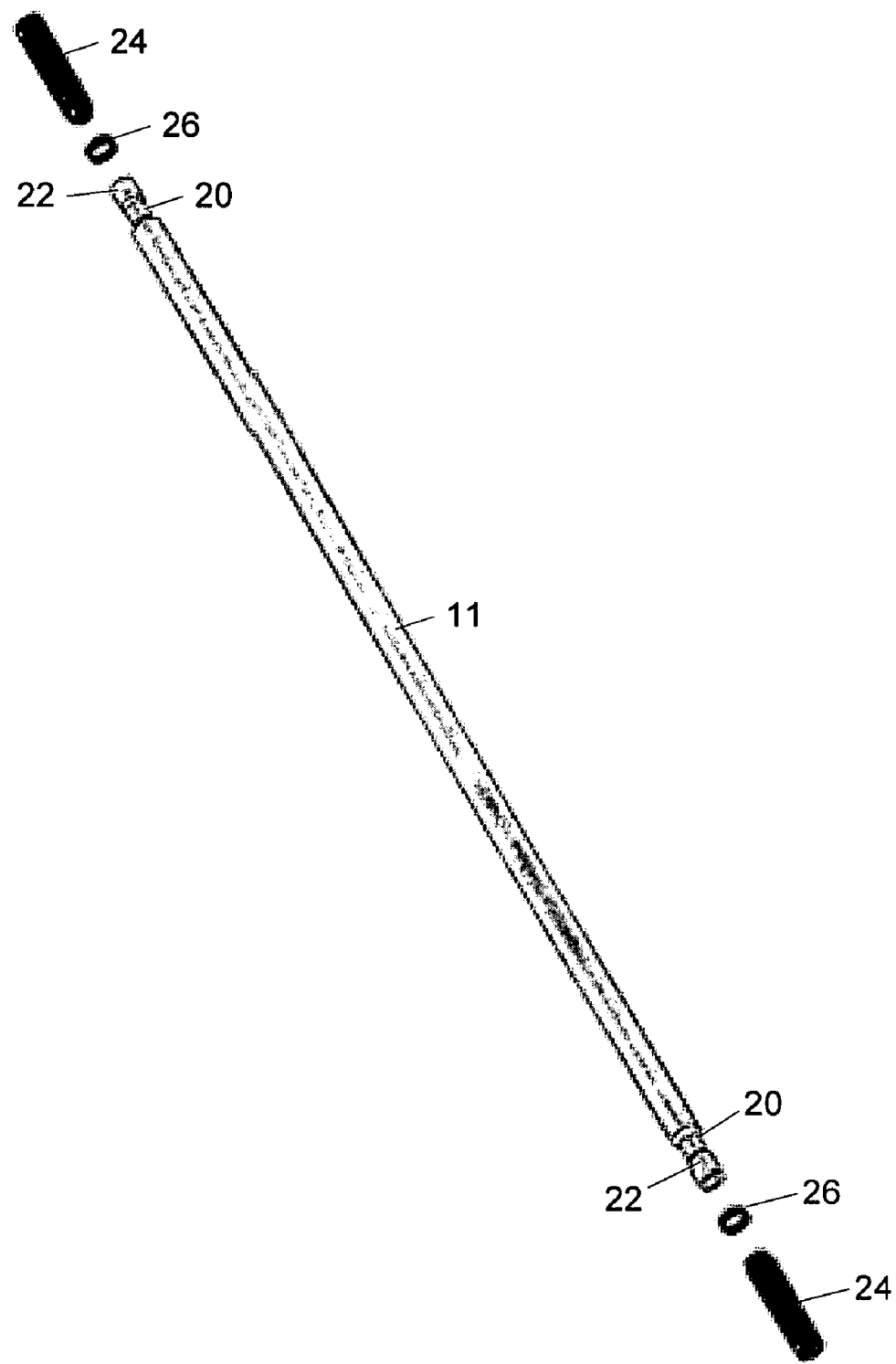
FIG. 2 is an exploded perspective view of a flow cell according to the present invention along with adjacent connectors.
Figure 2A:
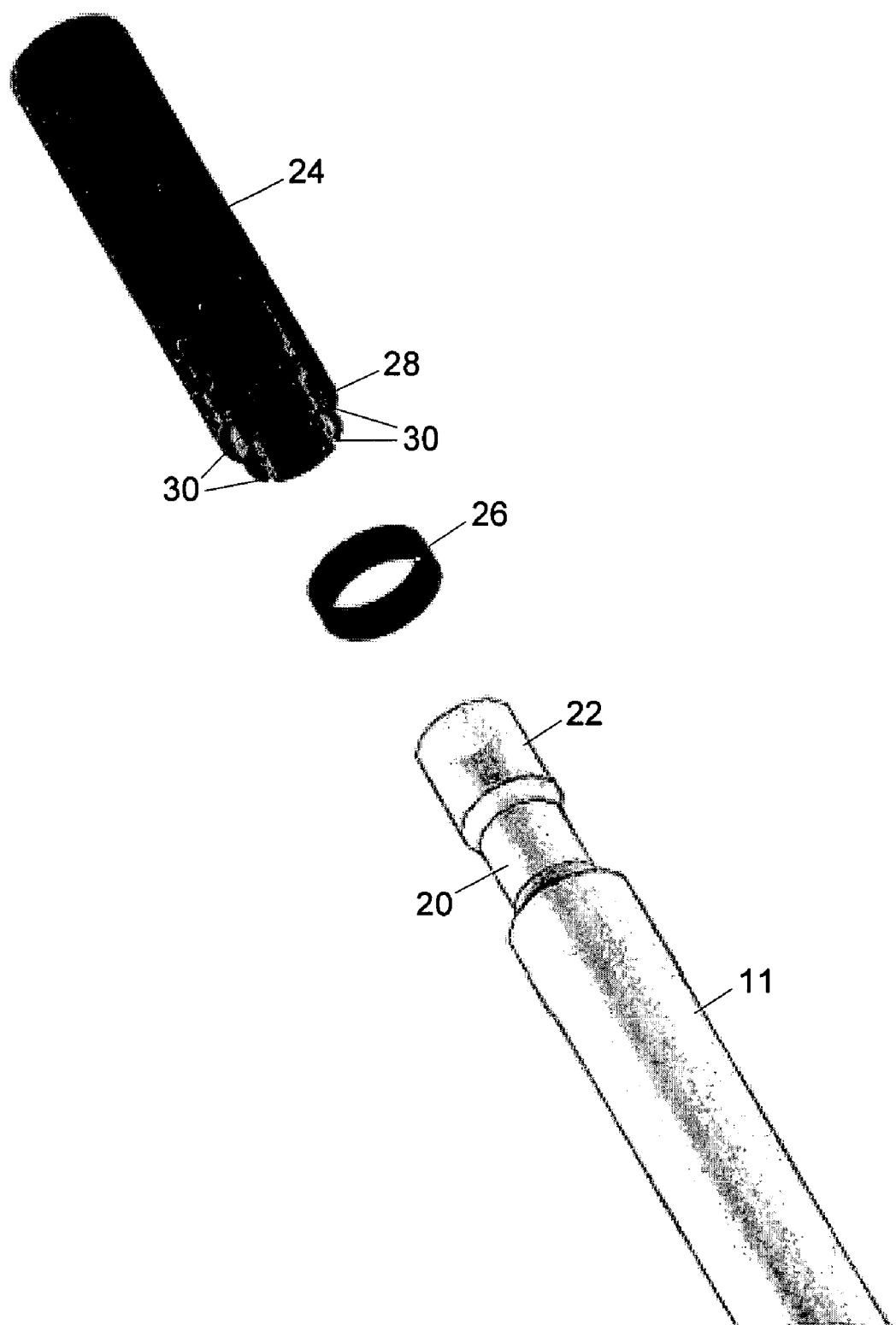
FIG. 2A is an exploded perspective view of one end of the flow cell of FIG. 2, along with an adjacent connector.

The flow cell 11 itself is shown in an isolated view in FIG. 2, adjacent to connecting elements used to secure the flow cell in place. At either end, the flow cell has a notch 20 that allows it to be easily connected and disconnected to the flow system. An enlarged view of one end of the flow cell is shown in FIG. 2A. As shown, the notch 20 has a narrower outer diameter than other parts of the flow cell. A restricting portion 22 on the end of the flow cell 11 has a somewhat larger diameter, and the main portion of the flow cell has an even larger diameter. Shown adjacent to the end of the flow cell are coupler 24 and retaining ring 26. The coupler is a material that is sufficiently rigid to maintain its shape, but that allows a small amount of flexibility. In an exemplary embodiment, this material is brass, but other materials may be used as well. The coupler has an end portion 28 with a smaller diameter than the main body of the coupler. Multiple slots 30 are located near the end of the coupler, covering both the end portion 28 as well as part of the coupler main body. The slots extend parallel to a longitudinal axis of the coupler, thereby forming flexible segments that can be expanded outward from the coupler axis. This outward movement allows the effective diameter of the end portion to be temporarily increased.

When the segments of the end portion 28 are expanded, the outer diameter of the end portion 28 is slightly larger than the inner diameter of retaining ring 26, and the inner diameter of the end portion 28 is slightly larger than the outer diameter of the restricting portion 22 of the flow cell. This allows the end portion 28 to be slid over the restricting portion 22 of the flow cell. When the end portion segments return to their original position, however, the inner diameter of the end portion 28 is smaller than the outer diameter of the restricting portion 22. In this state, the end portion is also small enough that the restricting ring 26 (which may also be brass) can fit around the end portion 28. Thus, in making the connection, the restricting ring may be slipped over the restricting portion 22 until it encircles the notch 20, and the end portion 28 may thereafter also be slipped over the restricting portion. Once the end portion is positioned so that it surrounds the notch 20, the end portion segments are returned to their original position, and the retaining ring 26 is slipped over the end portion. A sufficient pressure fit is formed between the ring 26 and the end portion 28 to keep the ring in place encircling the end portion. In this state, the inner diameter of the end portion is too small to allow it to be withdrawn over the restricting portion 22 of the flow cell, and the coupler 24 and the flow cell 11 are effectively locked together.

As evident in the cutaway view of the flow cell in FIG. 1, the inner diameter of the flow cell, in the vicinity of each restricting portion 22, tapers outward toward the ends of the flow cell 11. One of these tapered regions 32 is shown more clearly in the enlarged cutaway view of FIG. 3, which shows some of the system components in cross section. The tapering of this region allows for a seal to be formed with a tapered outer surface of a capillary 46. The capillary is made of a typical material, such as polyetheretherketone, but may be another material as well. The capillary is surrounded by a connector 34 that, in the exemplary embodiment, is made of brass, and fits around the outside of the capillary. The connector 34 has a threaded region 36 in which external screw threads are located. These screw threads mate with screw threads located on an inner surface of the coupler 24 at the end of the coupler away from the end portion 28.

Figure 3:
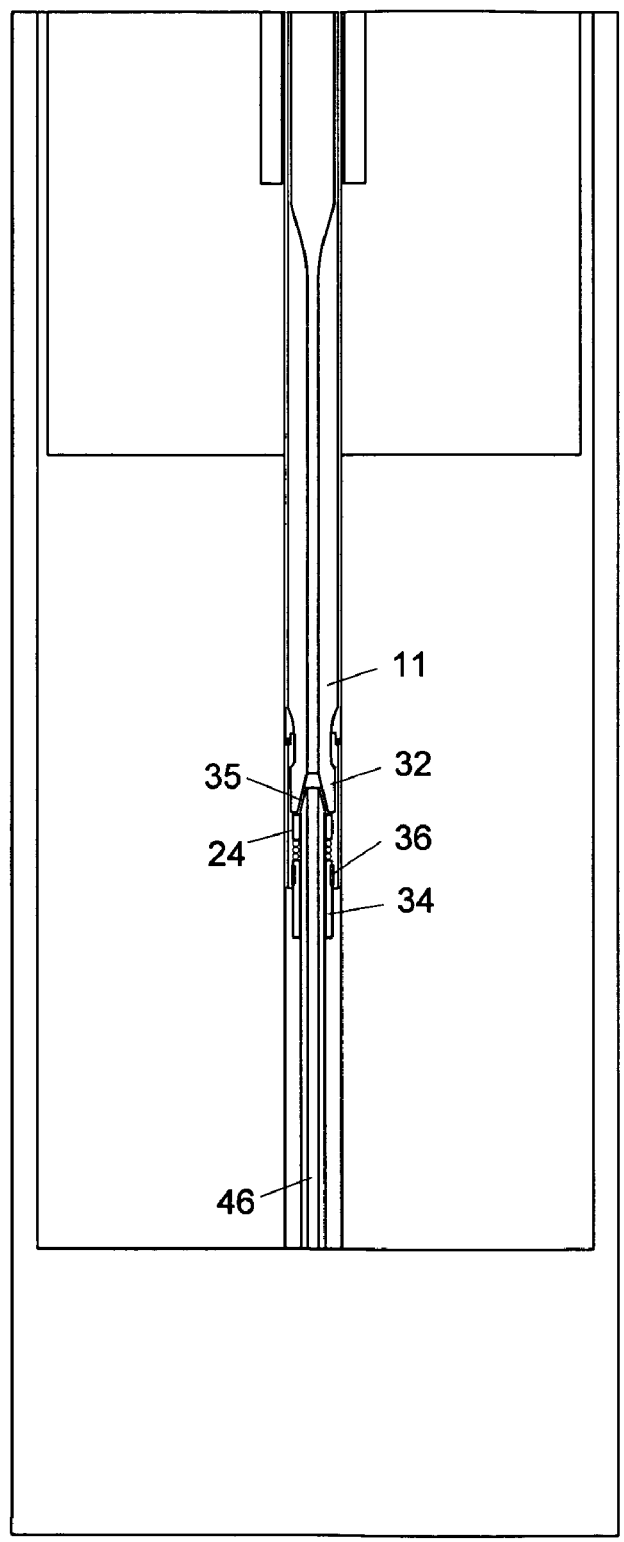
FIG. 3 is an enlarged schematic view of one end of the flow cell shown in FIG. 1 as positioned in the channel of a spectrometer probe.
Figure 4:
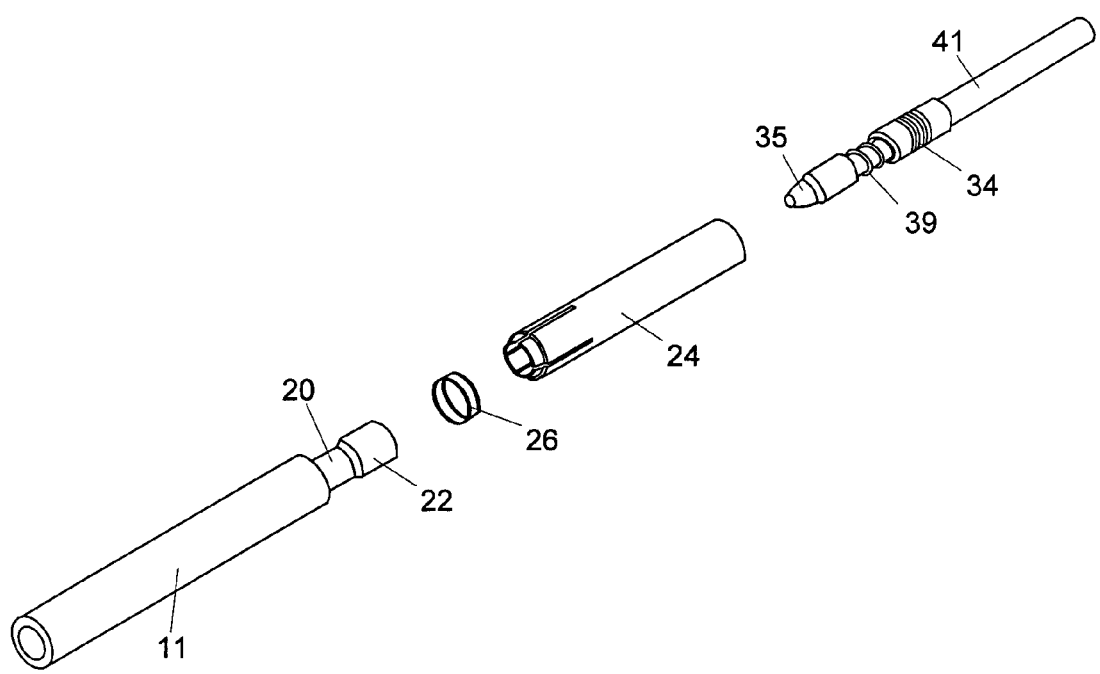
FIG. 4 is an exploded perspective view of the end of a capillary pathway and the associated connection components for connecting to a flow cell according to the present invention is connected.

FIG. 4 is an exploded perspective view of the connection components between the flow cell 11 and the end of one of the capillary pathways. The connector 34 has a tapered region 35 that, when the connector is coupled with the flow cell as shown in FIG. 3, is compressed against the tapered inner surface at the end of the flow cell. When the internal threads of the coupler 24 are engaged with the external threads 37 of the connector 34, and the coupler 24 and retaining ring 26 are in place in the notch of the flow cell, the tapered region 35 of the connector is tightly engaged with the tapered region 32 of the flow cell to form a fluid-tight seal. A compression spring 39 is located between the connector 34 and the tapered portion 35 to provide an engagement force between the tapered portion and the inner surface at the end of the flow cell. Since the coupler 34 is movable relative to tubing 41, this allows the spring force to be maintained on the fluid connection while the coupler 24 and the connector 34 are fastened together.

Figure 5:
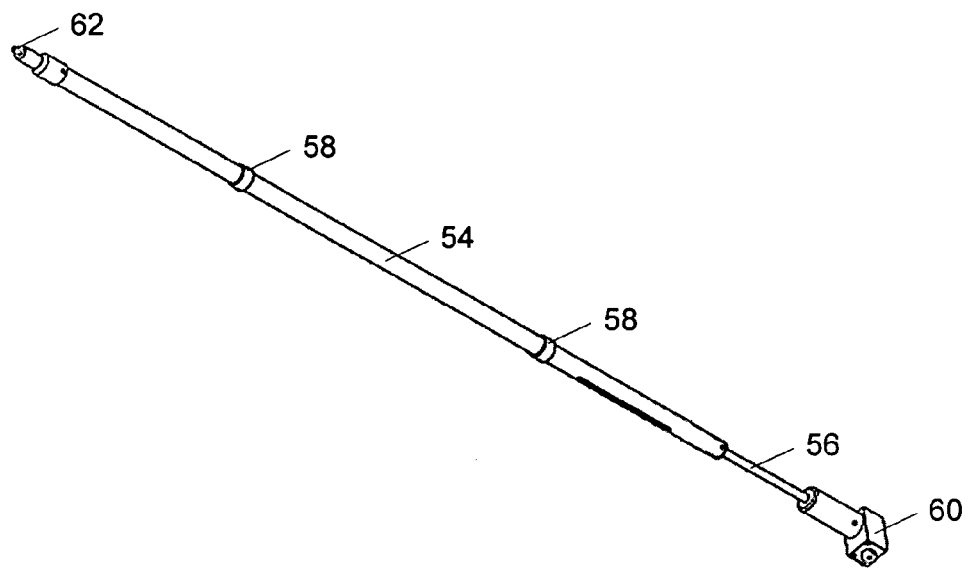
FIG. 5 is a perspective view of an insertion tool for housing a flow cell according to the present invention and inserting it into the channel of a spectrometer probe.

Shown in FIG. 5 is an insertion tool used for safely locating the flow cell in the proper region of the probe. The insertion tool includes an outer sheath 54 which is slidably engaged with an inner shaft 56. Located about the outer surface of the sheath are a plurality of spacers 58, that help locate the insertion tool within the bore of the magnet, as discussed in further detail below. The proximal end 60 of the insertion tool may have a handle that is graspable manually, while the distal end 62 is used for holding the flow cell.

The insertion tool has two portions that move relative to each other along a longitudinal axis of the tool. FIGS. 6A and 6B are cross sectional views of the insertion tool in a retracted state and an extended state, respectively. The handle 60 at the proximal end of the insertion tool connects to a shaft 64 that slides freely within the sheath 54. The sheath, however, is rigidly connected to shim stack interface 66. The shim stack interface connects to a shim stack that is rigidly fixed within the bore of the magnet, so that movement of the handle of the insertion tool results in the shaft 64 moving relative to the bore of the magnet, and a probe that is inserted in the lower region of the bore. Since the flow cell is connected to the lower end of the shaft 64, this allows the flow cell to be extended and retracted relative to the sheath. FIG. 6B shows the insertion tool in the extended position, such that the flow cell 11 extends from the distal end of the insertion tool.

Figure 7A:
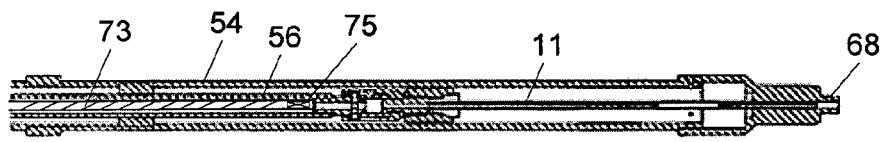
FIG. 7A is an enlarged view of a distal end of the insertion tool shown in FIG. 6A.
Figure 7B:
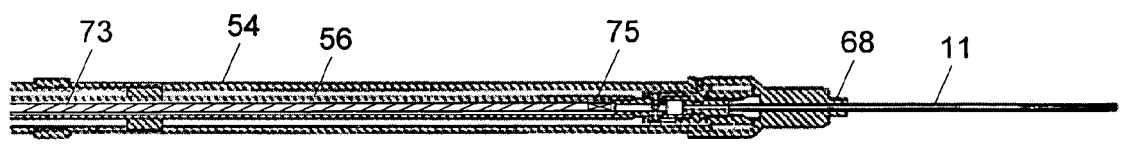
FIG. 7B is an enlarged view of a distal end of the insertion tool shown in FIG. 6B.

FIGS. 7A and 7B show enlarged views of the distal end of the insertion tool in the retracted and extended positions, respectively. The coupling mechanism between the rod 56 and the flow cell 11 is discussed above in more detail and shown in FIGS. 1–3. However, in the cross sections of FIGS. 7A and 7B, the movement of the flow cell relative to the distal end of the insertion tool can be clearly seen. When in the retracted position, the flow cell is completely encompassed by the insertion tool. However, when extended, the flow cell projects well past the alignment tip 68 at the end of the sheath 54.

Figure 8A:
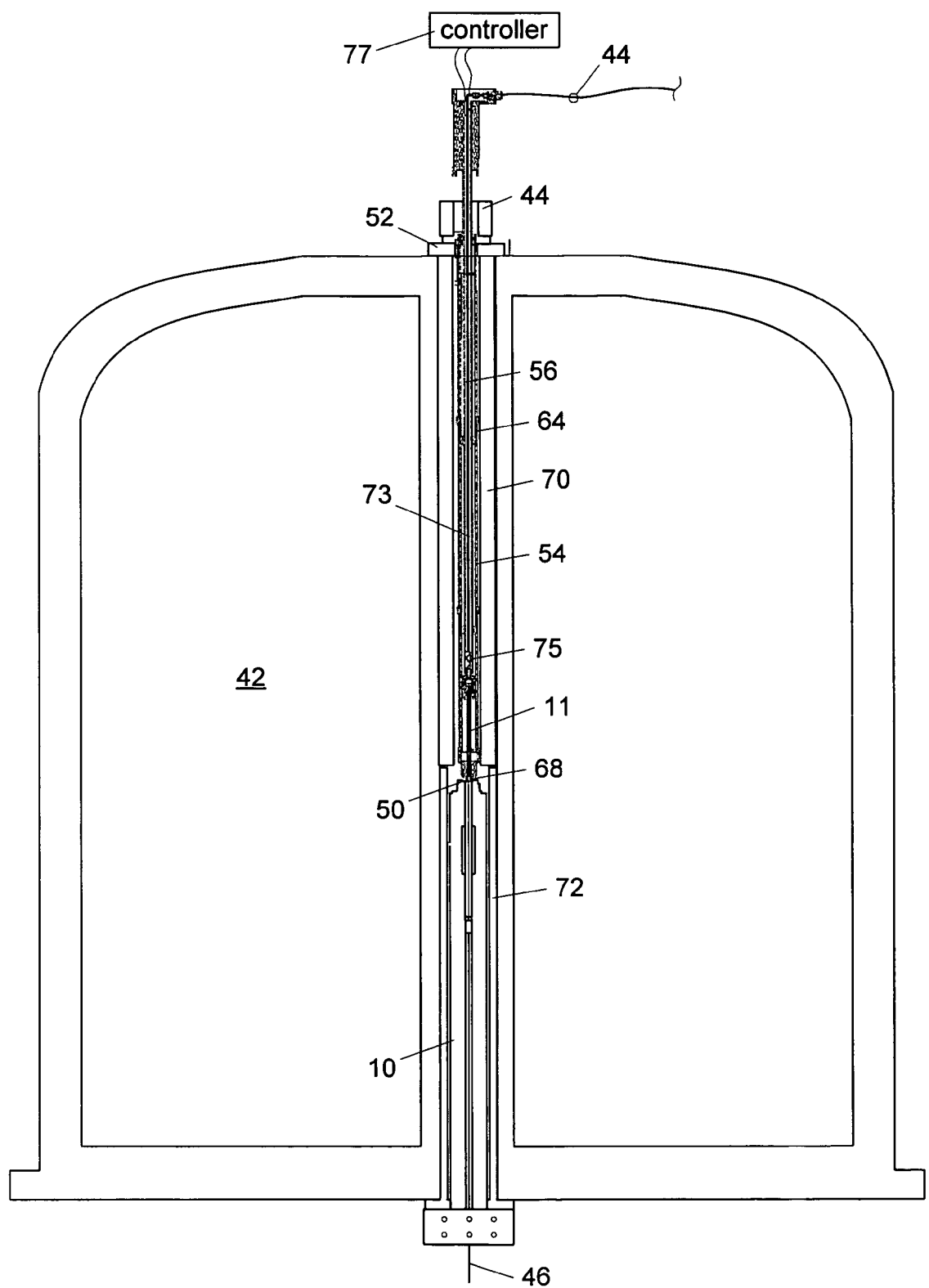
FIG. 8A is a cross-sectional, schematic view of a spectrometer according to the present invention, showing the magnet housing with the probe and insertion tool located therein, with the insertion tool in a retracted position.

When the insertion tool is in place in the magnet bore, it fits snugly within upper shim stack 70, as shown in FIG. 8A. The probe 10 extends through the other side of the magnet bore, and fits snugly within lower shim stack 72. The upper and lower shim stacks are connected together within the magnet bore, and provide a precise locating of the probe and insertion tool relative to each other. As shown in FIG. 8A, the alignment tip 68 also engages a concave region 50 (also shown in FIG. 1) at the top of the probe 10 to ensure proper axial alignment. When the probe is in place, and the flow cell is to be introduced to the probe, a capillary that is connected to the flow cell 11, and that extends from the distal end of the insertion tool, is threaded through the magnet bore and through the probe. The concave region 50 at the top of the probe facilitates the threading of the capillary.

Once the capillary has been threaded through the probe, the insertion tool, in the retracted position, is inserted into the upper shim stack. Since the flow cell 11 is contained within the insertion tool at the time of insertion, it is protected from any incidental damage during the insertion. The insertion tool is lowered into position with the alignment tip engaged within the concave region at the top of the probe, and the insertion tool is then secured to the upper shim stack. The handle at the proximal end of the insertion tool is then manipulated to move the shaft 56 and, correspondingly, the flow cell 11, relative to the sheath 54. The flow cell thereby extends into the probe 10 and, when the insertion tool is in the fully extended position, the flow cell is perfectly aligned with the probe such that the sample region of the flow cell is located within the RF coil. This position is shown in FIG. 8B.

Figure 8B:
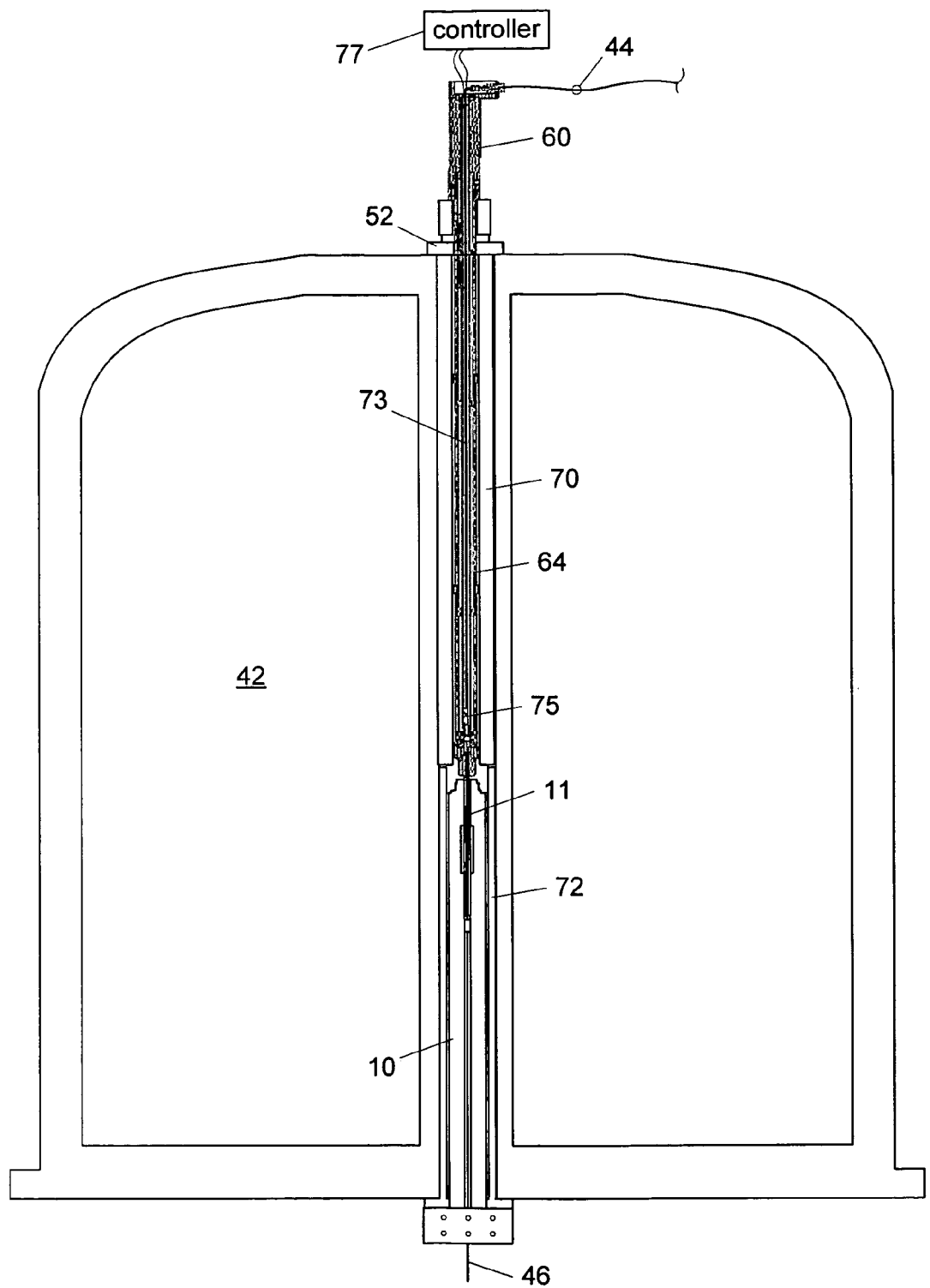
FIG. 8B is a cross-sectional, schematic view of a spectrometer according to the present invention, showing the magnet housing with the probe and insertion tool located therein, with the insertion tool in an extended position.

As shown in both FIGS. 8A and 8B, the capillary 44 enters through the handle of the insertion tool and resides within the shaft 64. The capillary 44 is surrounded in the shaft 64 by a resistive heating element 73. The heating element 73 may be a simple resistive heater, such as a wire through which a current is passed, and allows the temperature of the sample to be increased to a desired level. Many biological samples, for example, are best analyzed at a temperature of about 48° C. The temperature of the sample may be monitored with the use of a small thermocouple 75 in contact with the capillary 44 adjacent to the flow cell 11. The thermocouple generates a temperature signal that may be used to switch the heating element on and off to maintain a desired temperature. A controller 77 may be used to detect the feedback signal and control the power to the heating element accordingly. Although the controller is shown schematically in FIGS. 8A and 8B, those skilled in the art will understand that this controller may take many forms, including being part of a separate control station that operates other aspects of the spectrometer as well.

The present invention also provides for a simplified regimen for cleaning the probe 10. Repeated use, or leakage from a damaged flow cell, can result in the need to clean the interior of the probe. Foreign matter within the probe can otherwise lead to undesirable signal noise. In prior art systems, cleaning of a probe involves the removal of the probe to perform the cleaning operation. This necessitates the labor-intensive procedure of remounting and properly shimming the probe once the cleaning is completed. However, in one embodiment of the present invention, the probe may be cleaned while in place in the bore of the magnet.

The probe 10 of the present invention is completely separate from the remainder of the spectrometer. This can be seen more clearly in FIGS. 8A and 8B. A sealed magnet chamber 42 houses a superconducting magnet (not shown)

that surrounds the bore of the spectrometer. The probe 10 is inserted into the bore from the bottom of the system, and is fixed in this position, typically by bolts. The flow cell 11, when correctly positioned within the spectrometer using the insertion tool, has its sample region 12 positioned adjacent to the RF coil. A fluid connection to the top of the flow cell is provided by capillary tube 44, that extends through the insertion tool, while another fluid connection, to the bottom of the flow cell, is provided by capillary 46. With these input and output flow paths, a fluid sample may be easily introduced to the sample region through one of the capillaries, and subsequently removed through the other capillary.

Prior to cleaning, the insertion tool, flow cell and related capillary tubing are removed from the probe and magnet bore. A flushing hose (not shown) may then be inserted through the upper shim stack until it meets the top of the probe. The flushing hose may have an alignment tip that engages the concave region 50 on the top of the probe to ensure a tight fit. A solvent may then be transferred through the flushing tube and through the probe to flush out any undesired material remaining in the probe body. To facilitate this cleaning process, the probe has a smooth inner surface that is, for example, cylindrical. If desired, a brush or other solid cleaning implement may be used to manually dislodge material in the interior of the probe prior to and/or after flushing of the probe. In this way, a user with minimal training can easily clean the probe and thereafter insert an insertion tool/flow cell for continued analysis.

For analyzing multiple samples, there are several steps that provide a good measurement method. A sample introduction means, such as a pipetting robot, may be used for automatic handling of multiple samples. In such a system, the multiple liquid samples are each introduced one by one to the input side of the flow cell, such as through capillary 44. A pump forces the liquid through the capillary to the sample region of the flow cell 11. Once in the flow cell, the NMR analysis may commence. After collecting the desired NMR data, the pump may be used to force the sample out of the sample region, and through an output pathway, such as capillary 46. This output pathway may lead to a waste container, or some form of sample reclamation apparatus. After each sample is analyzed, an appropriate liquid is forced through the sample region to flush out any lingering traces of the sample. A new sample may then be introduced to the sample region, and the next analysis begun. Samples and flushing liquid may be interspersed throughout the input and output paths so as to allow the most efficient sample changing.

While the flow-through design of the present invention allows for quick sample changing without the need for discrete sample containers, it is also constructed so as to allow simple removal and replacement of the flow cell 11. By use of the insertion tool, the flow cell may be quickly an safely withdrawn from the center of the probe without removing the probe from the spectrometer bore. Prior to removing the insertion tool, the handle 60 is manipulated to place the insertion tool in the retracted position. This prevents any accidental damage to the flow cell. If the flow cell is to be changed, due to breakage or for any other reason, the process may be simplified by having a second insertion tool on hand that is pre-loaded with a flow cell and accompanying tubing. In such a case, the two ends of the capillary tubing need only be connected, respectively, to a sample source and an output container. A user with minimal training can thereby safely exchange the insertion tool and flow cell to allow analysis to continue.

Different circumstances may arise during which it is advantageous to remove the flow cell 11 from the probe. For example, it may be desirable to clean the flow cell or replace it with one of different configuration (for example, with a sample region having a different size or shape). It may also happen that the flow cell gets damaged, or even breaks in two. If the flow cell is damaged, but remains intact, the previously described method of removing the flow cell is sufficient. However, if the flow cell is broken in two, one piece of the flow cell may be withdrawn by removing the insertion tool, while the other piece is withdrawn manually by pulling capillary 46. Once removed from the probe, the damaged flow cell may be disconnected from the capillaries and an undamaged flow cell replaced in the insertion tool.

The interior channel of the probe may be a smooth cylindrical surface to simplify the cleaning process, and provide a snug fit for a cylindrical flow cell. The probe may also be structured to simplify the introduction of a flow cell or a cleaning implement. As discussed above, and shown in FIG. 1, a top region 50 of the probe in the vicinity of the probe channel is concave adjacent to the probe channel. This concave region helps to guide items being manually introduced into the probe channel. For example, when replacing a flow cell from the top of the spectrometer, the capillary 46 (shown in FIG. 5) must be directed through the probe channel and out the bottom of the probe. When manually introducing the capillary 46, the concave top region 50 of the probe simplifies the act of threading the capillary through the probe. Likewise, the concave top region 50 engages the alignment tip 68 of the insertion tool and, during a cleaning of the probe, may simplify the manual introduction of a cleaning implement to the probe channel.

While the invention has been shown and described with reference to one a particular embodiment thereof, those skilled in the art will recognize that various changes in form and detail may be made herein without departing from the spirit and scope of the invention as defined by the appended claims. For example, the flow of liquid through the flow cell may proceed from bottom to top, rather than top to bottom. The flow cell itself may take on different shapes or internal configurations, and different means of securing the capillaries to the flow cell may be used. Other variations in the basic structure of the invention may also be applied without straying from the basic inventive premise.

What is claimed is:

1. A magnetic resonance spectrometer apparatus comprising:
   a sample probe located in a bore of the spectrometer;
   a liquid sample container having a first opening at a first end of a longitudinal axis of the container and a second opening at a second end of the longitudinal axis, the sample container being configured to fit, at least partially, within a channel of the probe;
   a liquid input conduit having a first end connected to the first opening of the sample container and a second end that extends out of a first end of the spectrometer bore to allow connection to a liquid sample source; and
   a liquid output conduit having a first end connected to the second opening of the sample container and a second end that extends out of an end of the spectrometer bore opposite the first end, such that, while the sample container resides, at least partially, in the probe, a liquid sample may be introduced to the sample container via the input conduit, and withdrawn from the sample container via the output conduit.

2. An apparatus according to claim 1 wherein the sample container may be removed from the probe and the spectrometer without removing the probe from the spectrometer.

3. An apparatus according to claim 1 further comprising an insertion tool within which the flow cell may be housed while introducing it to the spectrometer bore.

4. An apparatus according to claim 1 wherein the insertion tool is switchable between a retracted position, in which the flow cell is substantially entirely enclosed by the insertion tool, and an extended position, in which the flow cell at least partially extends from the insertion tool.

5. An apparatus according to claim 1 wherein the sample container has flow paths adjacent, respectively, to the first end and the second end, and a sample region located between the flow paths that has a larger inner diameter than either of the flow paths.

6. An apparatus according to claim 5 wherein, during spectrometer operation, the sample region resides immediately adjacent to an RF coil of the probe.

7. An apparatus according to claim 1 further comprising a manually operable connector by which a removable fluid-tight connection may be made between the input conduit and the sample container.

8. An apparatus according to claim 7 wherein the connector is fixed to the input conduit, and includes a radially-flexible portion, and wherein the sample container comprises a notch adjacent to its first end, such that the radially-flexible portion of the connector can slide over the first end, encircle the notch of the sample container, and be radially restrained in the notch to create a detent that secures the connector to the sample container.

9. An apparatus according to claim 8 wherein the connector further comprises a retaining ring that can be drawn around the radially-flexible portion to provide said radially restraining.

10. An apparatus according to claim 7 wherein the connector is removably fixed to the input conduit.

11. An apparatus according to claim 7 further comprising a spring mechanism that provides a force between the input conduit and the sample container that biases the input conduit and sample container toward each other.

12. An apparatus according to claim 1 further comprising a restrictor that is located outside of the spectrometer bore and that is connected to one of the input conduit and the output conduit, the restrictor being positioned so as to limit the movement of the sample container in one direction along an axis of the bore, and thereby establish a predetermined position of the sample container relative to the probe.

13. An apparatus according to claim 1 further comprising a heating element adjacent to the input conduit that increases the temperature of a sample therein.

14. An apparatus according to claim 13 further comprising a temperature detector adjacent to the sample container that detects the temperature of the sample flowing into the sample container.

15. A liquid sample apparatus for a magnetic resonance spectrometer having a sample probe located in a spectrometer bore, the apparatus comprising:
   a liquid sample container having a first opening at a first end of a longitudinal axis of the container and a second opening at a second end of the longitudinal axis, the sample container being configured to fit, at least partially, within a channel of the probe adjacent to an RF coil of the probe, and being removable from the probe without removing the probe from the spectrometer;
   a liquid input conduit having a first end connected to the first opening of the sample container and a second end that extends out of a first end of the spectrometer bore to allow connection to a liquid sample source;
   a liquid output conduit having a first end connected to the second opening of the sample container and a second end that extends out of an end of the spectrometer bore opposite the first end, such that, while the sample container resides, at least partially, in the probe, a liquid sample may be introduced to the sample container via the input conduit, and withdrawn from the sample container via the output conduit;
   a manually operable connector by which a removable fluid-tight connection may be made between the input conduit and the sample container; and
   a manually operable connector by which a removable fluid-tight connection may be made between the output conduit and the sample container.

16. A probe for a magnetic resonance spectrometer having a magnet with a bore within which the probe may be located, the probe having an opening at each of two opposite ends and comprising a probe channel and an RF coil surrounding the probe channel such that a sample container located within the probe channel may be encompassed by the RF coil, wherein there is a fluid-tight seal between the probe channel and an interior of the probe so as to allow the flushing of a fluid through the probe channel without any leakage into the probe interior.

17. An insertion tool apparatus for introducing a sample container to a magnetic resonance spectrometer having a spectrometer bore and a spectrometer probe extending partially into the spectrometer bore from a probe side of the bore, the apparatus comprising:
   an outer sheath that has a longitudinal axis that aligns substantially with a longitudinal axis of the bore, and that may be secured to an insertion side of the bore opposite to the probe side; and
   an inner shaft to which the sample container may be secured, the inner shaft being at least partially encompassed by the outer sheath and being movable relative to the sheath along said longitudinal axis thereof; wherein the apparatus has a retracted position in which a relative positioning of the sheath and the inner shaft is such that the sample container is encompassed by the sheath, and an extended position in which the a relative positioning of the sheath and the inner shaft is such that the sample container extends, at least partially, from the sheath and into an analysis region of the probe.

18. A method of operating a magnetic resonance spectrometer having a sample probe located in a spectrometer bore, the apparatus comprising:
   providing a liquid sample container having a first opening at a first end of a longitudinal axis of the container and a second opening at a second end of the longitudinal axis, the sample container being configured to fit, at least partially, within a channel of the probe;
   connecting a first end of a liquid input conduit to the first opening of the sample container and a second end of the liquid input conduit to a liquid sample source;
   connecting a first end of a liquid output conduit to the second opening of the sample container and passing a second end of the liquid output out of an end of the spectrometer bore opposite the first end;
   introducing a liquid sample to the sample container through the input conduit while the sample container is, at least partially, encompassed by the probe;
   withdrawing a liquid sample from the sample container via the output conduit; and
   performing a magnetic resonance analysis of a sample while it resides in the sample container.

* * * * *

UNITED STATES PATENT AND TRADEMARK OFFICE
CERTIFICATE OF CORRECTION

PATENT NO.        : 7,145,340 B2
APPLICATION NO.   : 10/981386
DATED             : December 5, 2006
INVENTOR(S)       : Martin Rindlisbacher and Werner E. Maas It is certified that error appears in the above-identified patent and that said Letters Patent is hereby corrected as shown below:

Title Page of the patent, please replace Broker Biospin Corporation (the name of the Assignee) with Bruker Biospin Corporation.

Signed and Sealed this

Tenth Day of June, 2008

JON W. DUDAS
*Director of the United States Patent and Trademark Office*